US012585193B2

(12) United States Patent (10) Patent No.: US 12,585,193 B2
Patra (45) Date of Patent: Mar. 24, 2026

(54) OPTICAL SYSTEM FOR A LITHOGRAPHIC PROJECTION EXPOSURE APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 17 days.

(21) Appl. No.: 18/465,357

(22) Filed: Sep. 12, 2023

(65) Prior Publication Data

US 2024/0012333 A1 Jan. 11, 2024

Related U.S. Application Data

(63) Continuation of application No. PCT/EP2022/057013, filed on Mar. 17, 2022.

(30) Foreign Application Priority Data

Mar. 24, 2021 (DE) .......................... 102021202847.0

(51) Int. Cl.
*G03F 7/00* (2006.01)
(52) U.S. Cl.
CPC ...... *G03F 7/70191* (2013.01); *G03F 7/70175* (2013.01); *G03F 7/70033* (2013.01); *G03F 7/70725* (2013.01)
(58) Field of Classification Search
CPC ............. G03F 7/70033; G03F 7/70175; G03F 7/70191; G03F 7/70308; G03F 7/70566; G03F 7/70725
See application file for complete search history.

(56) References Cited

U.S. PATENT DOCUMENTS 6,198,793 B1 * 3/2001 Schultz ............... G03F 7/70083
378/146
6,507,440 B1 * 1/2003 Schultz ............... G03F 7/70058
359/627

(Continued)

FOREIGN PATENT DOCUMENTS

DE       102012208521 A1    6/2013
DE       102017215664 A     3/2019

(Continued)

OTHER PUBLICATIONS

International Search Report for corresponding PCT Appl No. PCT/EP2022/057013, dated Aug. 1, 2022.

(Continued)

*Primary Examiner* — Deoram Persaud
(74) *Attorney, Agent, or Firm* — Fish & Richardson P.C.

(57) ABSTRACT

An illumination optical unit serves for use in a lithographic projection exposure apparatus. The illumination optical unit serves to guide illumination light from a light source toward an object field. A structured object is arranged in the object field. The illumination optical unit is embodied such that the object field illuminated by the illumination optical unit has a field extent along a first field coordinate and a field extent, shorter in comparison, along a second field coordinate perpendicular thereto. The illumination optical unit is embodied such that the illumination light which impinges on the object field is polarized in a polarization direction that extends parallel to the shorter field extent along the second field coordinate. This yields an illumination optical unit which, firstly, can offer a high structure resolution and, secondly, can impose manageable properties on the optical design.

20 Claims, 6 Drawing Sheets

(56) References Cited

U.S. PATENT DOCUMENTS

| | | | |
|---|---|---|---|
| 6,970,233 B2 | 11/2005 | Blatchford | |
| 7,982,854 B2 | 7/2011 | Mann et al. | |
| 9,304,405 B2 | 4/2016 | Fiolka et al. | |
| 9,366,968 B2* | 6/2016 | Mann | G02B 26/0833 |
| 9,897,924 B2* | 2/2018 | Endres | G03F 7/70116 |
| 2002/0056815 A1 | 5/2002 | Mann et al. | |
| 2006/0152700 A1 | 7/2006 | Yamada | |
| 2007/0046921 A1 | 3/2007 | Takahashi et al. | |
| 2007/0236784 A1* | 10/2007 | Singer | G03F 7/70183 |
| | | | 359/380 |
| 2007/0242255 A1 | 10/2007 | Nagasaka | |
| 2009/0185153 A1 | 7/2009 | Epple | |
| 2012/0069312 A1* | 3/2012 | Mann | G03F 7/7015 |
| | | | 359/857 |
| 2015/0146183 A1 | 5/2015 | Deguenther et al. | |
| 2016/0327868 A1 | 11/2016 | Endres | |
| 2017/0336715 A1 | 11/2017 | Flagello et al. | |
| 2019/0317413 A1* | 10/2019 | Cheng | G03F 7/70633 |
| 2020/0089127 A1 | 3/2020 | Wolf | |
| 2020/0117093 A1 | 4/2020 | Baselmans et al. | |
| 2022/0381643 A1* | 12/2022 | Gwosch | G01M 11/0264 |
| 2024/0167806 A1* | 5/2024 | Lee | G01N 21/8806 |

FOREIGN PATENT DOCUMENTS

| | | | |
|---|---|---|---|
| DE | 102019200193 B3 | 2/2020 | |
| EP | 1890191 A1 | 2/2008 | |
| JP | 2005-303084 A | 10/2005 | |
| JP | 2017-528755 A | 9/2017 | |
| TW | 201523167 A | 6/2015 | |
| WO | WO 2005/098506 A1 | 10/2005 | |
| WO | WO 2009/053023 A2 | 4/2009 | |
| WO | WO 2013/156278 A1 | 10/2013 | |
| WO | WO 2014/131654 A1 | 9/2014 | |
| WO | WO 2019/215110 A1 | 11/2019 | |
| WO | WO 2020/225411 A1 | 11/2020 | |

OTHER PUBLICATIONS

German Examination Report, with English translation thereof, for corresponding DE Appl No. 10 2021 202 847.0, dated of Aug. 26, 2021.

Pforr, R., et al.: "*Polarized light for resolution enhancement at 70 nm and beyond*", Proceedings of SPIE vol. 5754, Seiten 92-106 (2005).

Nishinaga, H., et al.: "*Development of polarized-light illuminator and its impact*", Proceedings of SPIE vol. 5754, Seiten 669-680 (2005).

Office Action in Taiwanese Appln. No. 111110034, mailed on Aug. 8, 2025, 6 pages (with English translation).

Search Report in Taiwanese Appln. No. 111110034, mailed on Aug. 7, 2025, 2 pages (with English translation).

Office Action in Japanese Appln. No. 2023-558493, mailed on Nov. 4, 2025, 6 pages (with English translation).

Office Action in Korean Appln. No. 10-2023-7035473, mailed on Dec. 4, 2025, 8 pages (with English translation).

* cited by examiner

OPTICAL SYSTEM FOR A LITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2022/057013, filed Mar. 17, 2022, which claims benefit under 35 USC 119 of German Application No 10 2021 202 847.0, filed Mar. 24, 2021. The entire disclosure of each these applications is incorporated by reference herein.

FIELD

The disclosure relates to an optical system for a lithographic projection exposure apparatus. Further, the disclosure relates to a projection exposure apparatus comprising such an optical system, a method for producing a structured component, and a microstructured or nanostructured component produced by this method.

Optical systems with illumination optical units of the type set forth at the outset are known from WO 2019/215110 A1, US 2017/0336715 A1, WO 2013/156278 A1, DE 10 2019 200 193 B3, U.S. Pat. No. 9,304,405 B2, WO 2014/131654 A1, U.S. Pat. No. 7,982,854 B2 and DE 10 2012 208 521 A1.

SUMMARY

The present disclosure seeks to develop an optical system of the type set forth at the outset, in such a way that, firstly, it offers a high structure resolution and, secondly, it imposes manageable properties on the optical design.

In an aspect, the disclosure provides an optical system for a lithographic projection exposure apparatus comprising an illumination optical unit embodied to guide illumination light from an EUV light source to an object field, a structured object being arrangeable in the object field. The illumination optical unit is embodied such that the object field illuminated by the illumination optical unit has a field extent along a first field coordinate and a field extent, shorter in comparison, along a second field coordinate perpendicular thereto. The illumination optical unit is embodied such that the illumination light which impinges on the object field is polarized in a polarization direction that extends parallel to the shorter field extent along the second field coordinate. The optical system also comprises a projection optical unit for guiding the illumination light and imaging light from the object field toward an image field, in which a substrate is arrangeable and onto which object structures are intended to be imaged. The optical system is embodied to generate one-dimensional image structures by imaging one-dimensional object structures of the object. An exit pupil of the projection optical unit in a pupil plane has an extent with a pupil aspect ratio between a longer pupil extent in a longitudinal direction of extent and a shorter pupil extent in a transverse direction of extent that is greater than 3.

What was initially recognized according to the disclosure is that an illumination optical unit which generates polarized illumination light parallel to the shorter field extent of the object field is particularly suitable for use in a projection exposure apparatus used to illuminate and image one-dimensional object structures. For example, what was recognized is that it is advantageous in this respect if the illumination optical unit defines a polarization that is parallel to the shorter field extent of the object field. There can then be illumination with an illumination pupil extended along the transverse dimension to the direction of extent of the one-dimensional object structures, as a result of which a projection exposure with a high throughput and/or a high structure resolution is facilitated. For example, the illumination light may be linearly polarized.

What is exploited here is that an achievable contrast of an image representation depends on the polarization state of the radiation. There can be a significant influence of the polarization state, for example in the case of fine structures to be imaged, that is to say structures with a short period. In the case of a given numerical aperture, the imageable structure dimension of one-dimensional structure arrangements is significantly smaller than the imageable structure dimension of two-dimensional structure arrangements. Therefore, a control of the polarization state can be relevant in the case of an optical system designed for imaging one-dimensional object structures.

The design considerations for an optical system can be relaxed if the optical system is designed for imaging one-dimensional object structures. Then, an exacting resolution is regularly not required along one direction of extent of the structure of these object structures, and so the imaging quality in the direction of extent of the structure is relaxed, as, accordingly, are the design properties in relation to the optical system. What was recognized for example in this case is that the imaging of one-dimensional object structures only involves an illumination of the image with significantly different angles along one direction of pupillary extent. Therefore, the exit pupil of the projection optical unit can be designed with a pupil aspect ratio that differs significantly from 1, that is greater than 3 and that may also be greater than 3.5, 4, 4.5, 5, 5.5, 6, 6.5, 7, 7.5, 8, 8.5, 9 or 9.5 or that may also be greater than 10. In the transverse direction of extent of the pupil, optical components of the projection optical unit of the optical system close to the pupil desirably have a small extent in comparison with the longitudinal direction of extent of the pupil, reducing the production costs of the optical components and reducing the properties in relation to installation space. In the case of a projection optical unit with a directionally independent imaging scale, it may moreover be sufficient to illuminate the object structures with significantly different illumination angles only along one direction of pupillary extent. Then, the illumination pupil can be designed with a pupil aspect ratio that is significantly different from 1. In the transverse direction of extent of the pupil, it is possible for the optical components of the illumination optical unit close to the pupil to have a small extent in comparison with the longitudinal direction of extent of the pupil, additionally reducing the production costs of the optical components and additionally reducing the properties in relation to installation space.

The one-dimensional object structures can be line profiles. An object of profile in another form can also be imaged accordingly.

The illumination optical unit can comprises a polarization deflection mirror at which there is a deflection of the incident illumination light through a deflection angle in the range of between 75° and 100°, the polarization direction being perpendicular to a plane of incidence of the illumination light on the mirror. Such a polarization deflection mirror can help ensure a desired polarization of the illumination light with a polarization direction parallel to the direction of extent of the structure. The deflection angle may be in the range between 75° and 95° and may for example be in the range between 80° and 90°.

As an alternative or in addition to a polarization of the illumination light by way of a simple beam deflection, it is also possible to use polarization concepts described in the prior art, for example in WO 2013/156278 A1, DE 10 2019 200 193 B3, U.S. Pat. No. 9,304,405 B2, WO 2014/131654 A1, U.S. Pat. No. 7,982,854 B2 and DE 10 2012 208 521 A1.

The incident illumination light at the polarization deflection mirror can run in a plane of incidence which deviates by no more than 15° from the plane specified by the first field coordinate and a normal to the object field. Such a fixed and hence known orientation of the extent of the structure can be advantageously exploited by virtue of the geometry of the beam deflection.

A further mirror, can be comprised by the illumination optical unit in addition to the polarization deflection mirror, and can be impinged by an angle of incidence of the illumination light that is less than 25°. Such an impingement of the further mirror of the illumination optical unit can help facilitate very efficient reflection of the illumination light. Moreover, such an impingement with a small angle of incidence may offer arrangement advantages in the case of this further mirror, for example should the further mirror be a pupil mirror. The angle of incidence of the illumination light on this further mirror may be less than 20°, may be less than 15° and may also be less than 10°.

In some embodiments, the polarization deflection mirror is in the form of a field facet mirror. In some embodiments, the polarization deflection mirror is in the form of a pupil facet mirror. In some embodiments, the illumination optical unit comprises two polarization deflection mirrors, at which the incident illumination light is deflected by a deflection angle in the range of between 80° and 100°, the planes of incidence of the illumination light on the polarization deflection mirrors being parallel to one another or coinciding with one another, and the polarization direction being perpendicular to the planes of incidence of the illumination light on the polarization deflection mirrors. Such embodiments of the polarization deflection mirror have been found to be particularly advantageous. A multiplication of the polarization effects of the two polarization deflection mirrors can arise in embodiments in the multiple polarization deflection mirror embodiments referred to in this paragraph.

An illumination pupil of the illumination optical unit can have a pupil aspect ratio that differs from 1. Aspects of such an optical system can correspond to those which were already explained above.

The image field can have a field extent along a first field coordinate and a field extent, shorter in comparison, along a second field coordinate perpendicular thereto, the optical system being embodied for imaging one-dimensional object structures that extend in a direction of extent of the structure that extends parallel to the shorter field extent of the object field. Aspects of such an optical system can correspond to those noted above. For example, the optical system can be designed in such a way that the object is not displaced during the imaging thereof within the scope of the projection operation.

The longitudinal direction of extent of the exit pupil and a normal the object field can define a plane, to which a direction of extent of the shorter field extent of the object field is perpendicular. Such an orientation relationship can lead to an optimized object illumination for imaging correspondingly oriented object structures.

The aspects of a projection exposure apparatus described herein, a production method described herein, and of a microstructured or nanostructured component produced described herein can correspond to those which have already been explained above with reference to the optical system. On account of the short illumination light wavelength, an EUV light source can facilitates a relatively high structure resolution. A microstructured or nanostructured component, such as a semiconductor component, for example a memory chip, can be produced using the projection exposure apparatus.

The optical system may be embodied as a scanner for example. The object holder of the optical system need not be driven synchronously with the substrate holder, but may rig-idly hold the structured object to be imaged. This can increase the throughput of the projection exposure apparatus when generating structured components, since scanner dead times, for example, can be reduced.

The substrate displacement direction may run along the shorter field extent of the image field.

Exemplary embodiments of the disclosure are explained in greater detail below with reference to the drawings.

DETAILED DESCRIPTION

Figure 1:
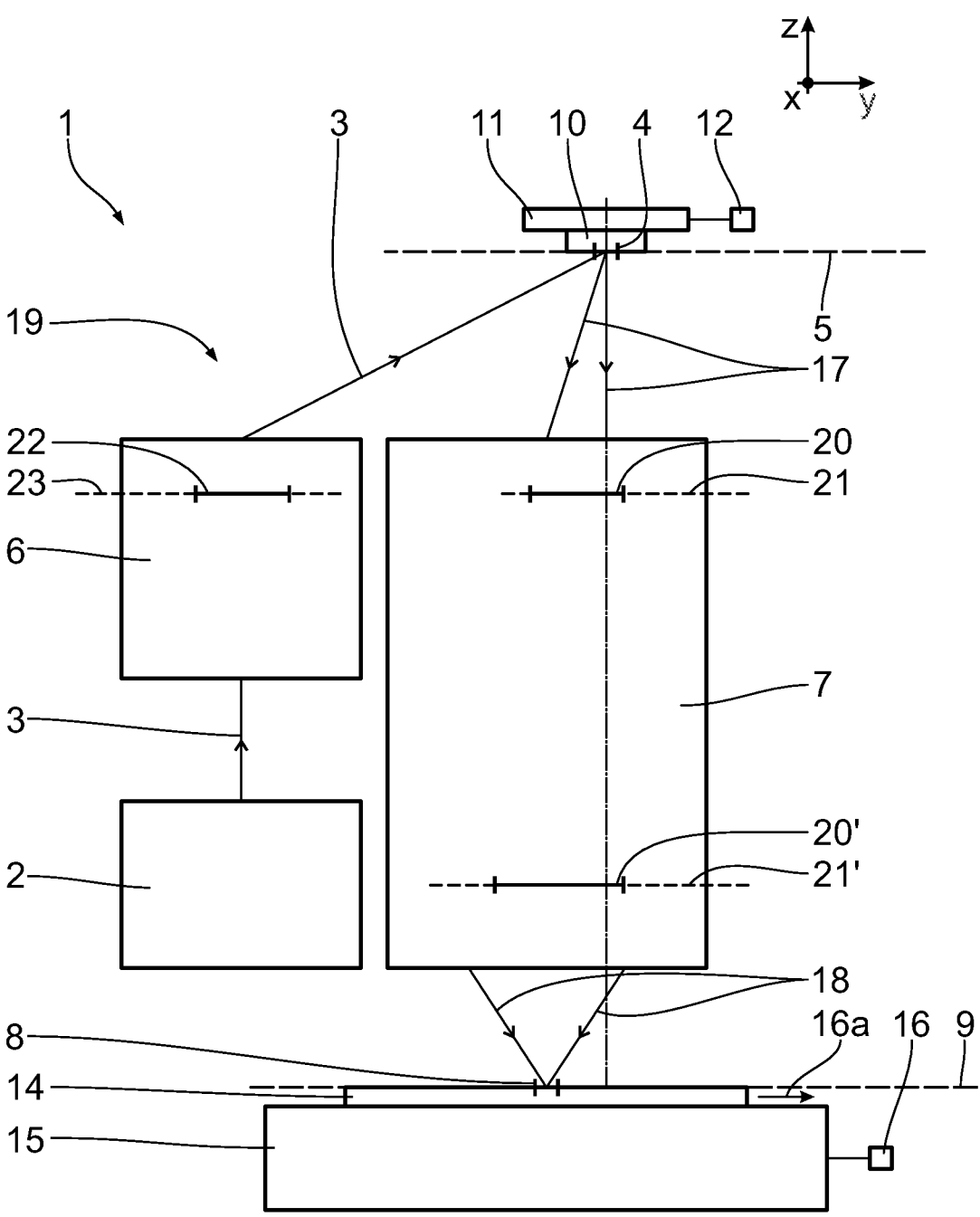
FIG. 1 schematically shows a microlithographic projection exposure apparatus.

A microlithographic projection exposure apparatus 1 comprises a light source 2 for illumination light or imaging light 3. The light source 2 is an EUV light source, which produces light in a wavelength range of, for example, between 5 nm and 30 nm, for example between 5 nm and 15 nm. The light source 2 can be a plasma-based light source (laser-produced plasma (LPP), gas-discharge produced plasma (GDP)) or else a synchrotron-based light source, for example a free electron laser (FEL), a synchrotron-based light source being able to be operated in circular polarized fashion for example. For example, the light source 2 can be a light source with a wavelength of 13.5 nm or a light source with a wavelength of 6.7 nm. Other EUV wavelengths are also possible. In general, the illumination light 3 guided in the projection exposure apparatus 1 could even have any desired wavelength, for example visible wavelengths or else other wavelengths which may find use in microlithography (for example DUV, deep ultraviolet) and for which suitable laser light sources and/or LED light sources are available (by way of example 365 nm, 248 nm, 193 nm, 157 nm, 129 nm, 109 nm). A beam path of the illumination light 3 is illustrated very schematically in FIG. 1.

An illumination optical unit 6 is used to guide the illumination light 3 from the light source 2 to an object field 4 in an object plane 5. Using a projection optical unit or imaging optical unit 7, the object field 4 is imaged into an image field 8 in an image plane 9 with a predefined reduction scale. This reduction scale, which is also referred to as an imaging scale, may optionally be directionally dependent, in which case the projection optical unit 7 is referred to as anamorphic.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction extends perpendicular to the plane of the drawing out of the latter. The y-direction extends to the right in FIG. 1 and the z-direction extends upward.

Figure 2:
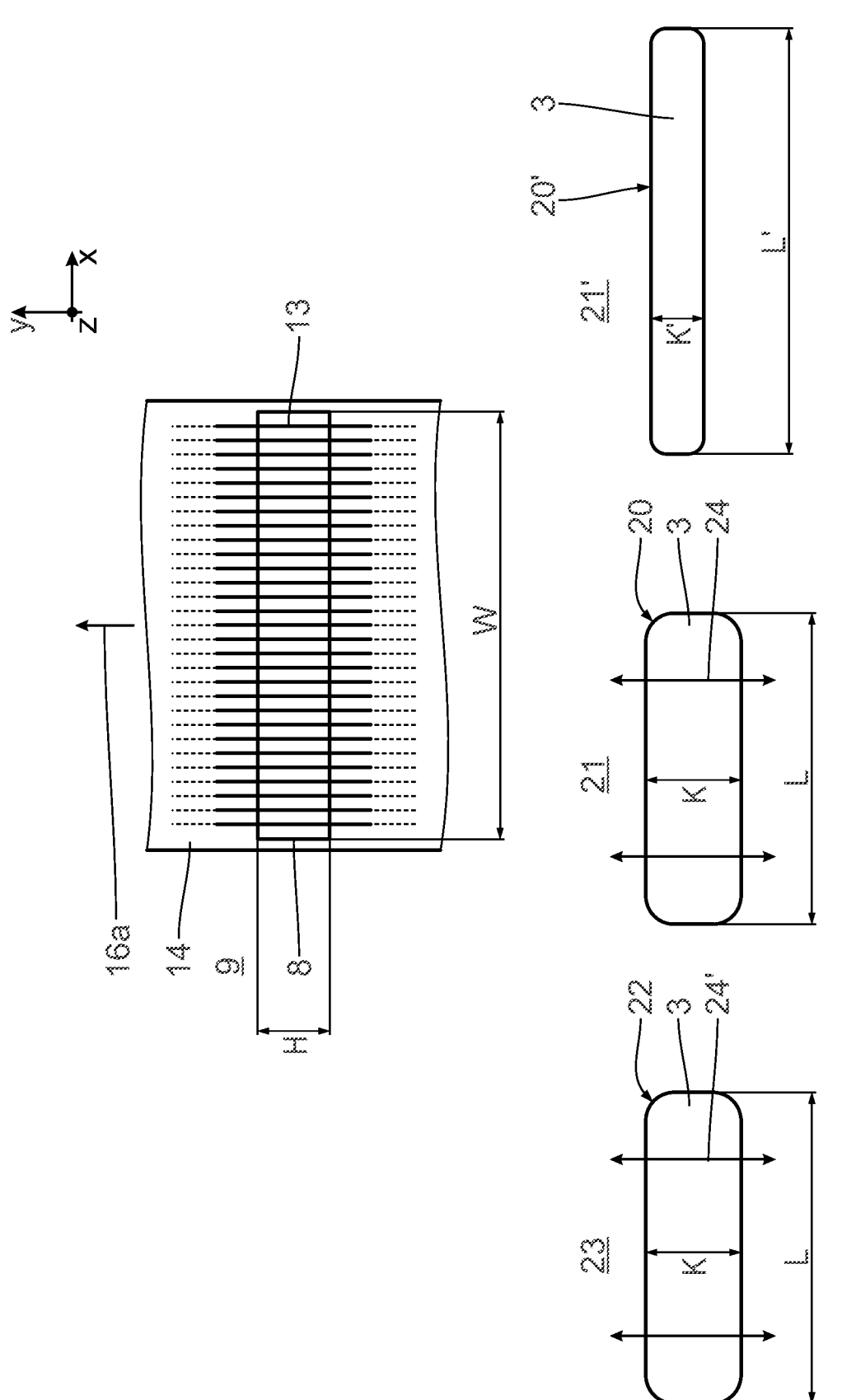
FIG. 2 schematically firstly shows a plan view of an image field of a projection optical unit of the projection exposure apparatus with imaged one-dimensional object structures and shows a plan view of a cross section, taken in a pupil plane, of an illumination light beam of the illumination light including a polarization direction of the illumination light, for elucidating for example a parallelism firstly of the polarization direction and secondly of the direction of extent of the structure.

In the projection optical unit 7, the object field 4 and the image field 8 may have a bent or curved embodiment and, for example, an embodiment shaped like a partial ring. A radius of curvature of this field curvature can be 81 mm on the image side. A basic form of a marginal contour of the object field 4 or of the image field 8 has a corresponding bend. Thus, a ring field radius of the image field 8 is 81 mm. Details in respect of this "ring field radius" parameter can be found in WO 2005/098506 A1. A definition of the ring field radius can be found in WO 2009/053023 A2. Alternatively, it is possible to embody the object field 4 and the image field 8 with a rectangular shape. Such an embodiment of a rectangular image field 8 is depicted in FIG. 2. The image field 8 may be delimited by a stop; the corresponding delimited region of the object field 4 that is conjugate to the image field 8 is also referred to as a scanning slot. The object field 4 and the image field 8 have an x/y-aspect ratio of greater than 1. Therefore, the object field 4 has a longer object field dimension (field extent W) in the x-direction and a shorter object field dimension (field extent H) in the y-direction. These object field dimensions extend along the field coordinates x and y.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

The image plane 9 may be arranged parallel to the object plane 5 in the case of the projection optical unit 7. What is imaged in this case is a portion of a lithography mask 10, which is embodied as a reflection mask and also referred to as reticle, coinciding with the object field 4. The reticle 10 is supported by a reticle holder 11. The reticle holder 11 can be displaced by a reticle displacement drive 12. The displacement direction of the reticle displacement drive 12, which is also referred to as scanning direction, is the y-direction. The reticle holder 11 is also referred to as mask holder. The reticle displacement drive 12 is also referred to as mask displacement drive. The reticle displacement drive 12 may also be dispensed with in one of the embodiments of the projection exposure apparatus 1. Then, the reticle 10 is not displaced during the projection operation of the projection exposure apparatus 1.

The reticle or the lithography mask 10 carries one-dimensional object structures that extend along a direction of extent of the structure. This direction of extent of the structure extends in the y-direction. These one-dimensional object structures present on the reticle are imaged onto one-dimensional image structures 13 (cf. FIG. 2) which likewise extend in the y-direction.

Examples of one-dimensional object structures are dense lines extending in the y-direction. Examples in this respect are specified in WO 2019/215110 A1.

The imaging of the object structures on the reticle 10 by way of the projection optical unit 7 is implemented on the surface of a substrate 14 in the form of a wafer, which is carried by a substrate holder 15. The substrate holder 15 is displaced by a wafer displacement drive or substrate displacement drive 16 (object displacement direction 16a, cf. FIG. 2) FIG. 1 schematically depicts, between the reticle 10 and the projection optical unit 7, a beam 17 of the illumination light 3 that enters into the projection optical unit and, between the projection optical unit 7 and the substrate 14, a beam 18 of the illumination light 3 that emerges from the projection optical unit 7. An object-field-side numerical aperture (NA$_O$, yz) and an image-field-side numerical aperture (NA$_I$, yz) of the projection optical unit 7 are not reproduced true to scale in FIG. 1.

The projection optical unit 7 has an entrance pupil plane 21 and an exit pupil plane 21'. The entrance pupil 20 forms a region of the entrance pupil plane 21 delimited by a marginal contour. Analogously, the exit pupil 20' forms a region of the exit pupil plane 21' delimited by a marginal contour. The shape of the boundary of the entrance pupil 20 can be described by the ratio of the object-field-side numerical apertures (NA$_O$, yz) and (NA$_O$, xz). The shape of the boundary of the exit pupil 20' can be described by the ratio of the image-field-side numerical apertures (NA$_I$, yz) and (NA$_I$, xz).

The entrance pupil 20 and the exit pupil 20' are optically conjugate to one another. If the projection optical unit 7 is anamorphic, that is to say the imaging scale is directionally dependent, the shape of the entrance pupil 20 differs from the shape of the exit pupil 20'. Such anamorphic projection optical units 7 are known from WO 2019/215110 A1, for example.

The illumination optical unit 6, the object holder or reticle holder 11, the projection optical unit 7 and the substrate holder 15 are constituent parts of an optical system 19 of the projection exposure apparatus 1. The optical system 19 is embodied for imaging one-dimensional object structures. A criterion for such an embodiment is that, for example, the exit pupil 20' is not circular but has a much larger diameter along one orientation than along an orientation orthogonal thereto.

FIG. 2, top, shows a plan view of the image structures 13 arising in the image field 8. The substrate 14 on which the image structures 13 arise is scanned in the y-direction, that is to say in the object displacement direction 16a, using the substrate displacement drive 16. Since the image structures 13 are uniformly structured in this y-direction, the reticle carrying the associated object structures need not likewise be displaced in the y-direction but may remain stationary in the reticle holder 11, increasing the throughput of the projection exposure apparatus 1. Thus, an orientation of the image structures 13 in the object displacement direction 16a is particularly advantageous and is exploited below.

FIG. 2, top, also depicts the field extents W in the x-direction and H in the y-direction of the image field 8. The object field 4 has corresponding field extents W, H, which are scaled by the respective imaging scale of the projection optical unit 7.

In accordance with the x/y aspect ratio of object field 4 and image field 8 of greater than 1, the following applies: W>H. The field extent W is regularly more than five times or even more than ten times larger than the field extent H. In the image field 8, the field extent W may be 26 mm, for example, and the field extent H may range between 1 mm and 2 mm, for example.

FIG. 2, bottom center, shows a marginal contour of an entrance pupil 20, the entirety of which can be filled with illumination light 3. Shown is a xy-cross section of this marginal contour, approximately stadium-shaped, of the entrance pupil 20 in an entrance pupil plane 21 of the projection optical unit 7 (cf. FIG. 1). Furthermore, FIG. 2, bottom right, shows an associated exit pupil 20' of the projection optical unit and, bottom left, shows an associated illumination pupil 22 of an illumination optical unit 6. FIG. 2 is schematic inasmuch as both the image plane 9 and the entrance pupil plane 21, the illumination pupil plane 23 and the exit pupil plane 21' appear in the plane of the drawing therein, even though entrance pupil plane, exit pupil plane and image plane, as shown in FIG. 1 for example, are mutually spaced apart.

The relative position of the entrance pupil plane 21 and the relative position of the illumination pupil plane 23 correspond or only differ slightly from one another. The illumination optical unit 6 may have additional internal pupil planes that are conjugate to the illumination pupil plane 23. Entrance pupil 20 and illumination pupil 22 often correspond, that is to say they have an identical shape and relative position. However, the illumination pupil 22 can also be larger or smaller than the entrance pupil 20; the first case is also referred to as dark-field illumination.

Figure 8:
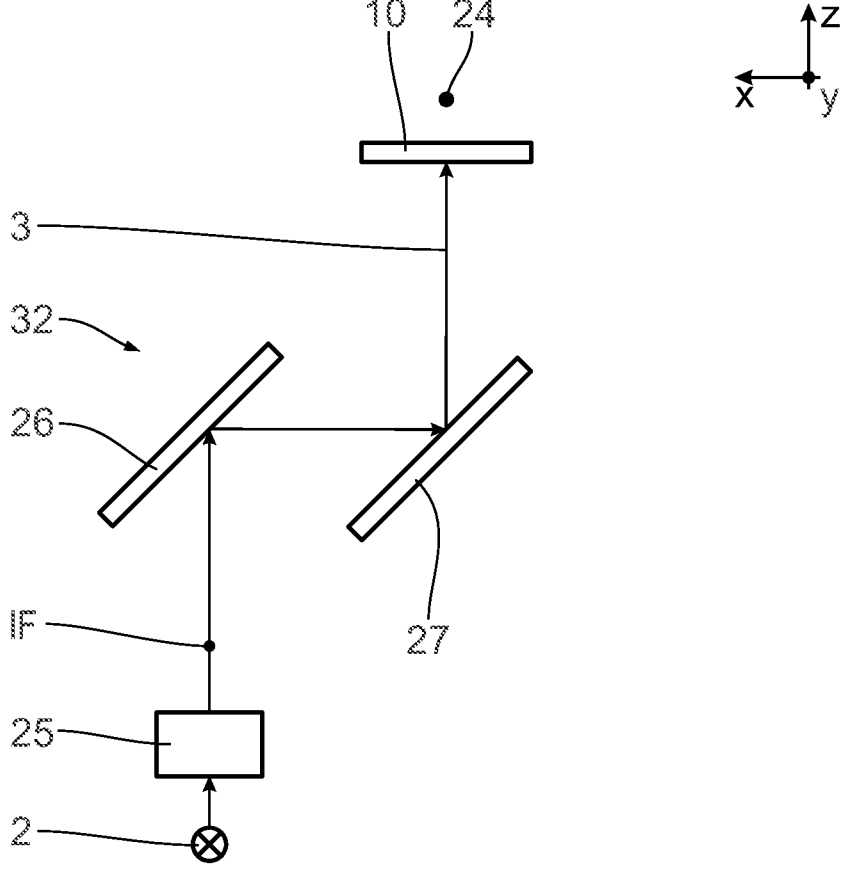
FIG. 8 shows, in a representation similar to that of FIG. 4, the embodiment according to FIG. 7, as seen from viewing direction VIII in FIG. 7.

In the exit pupil plane 21', the exit pupil 20' has an extent with a pupil aspect ratio between a longer pupil extent in a longitudinal direction of extent parallel to the x-direction and a short pupil extent in a transverse direction of extent parallel to the y-axis that is greater than 3. A projection optical unit with an exit plane 20' with a large aspect ratio is known from FIGS. 8 to 10 in WO 2019/215110 A1 for example.

This aspect ratio is elucidated on the basis of FIG. 2, with the longer pupil extent being plotted at L or L' and the shorter pupil extent being plotted at K or K'. In the depicted embodiment, an exit pupil aspect ratio L'/K' of approximately 6:1 arises. Thus, the image structures 13 are impinged with a significantly larger angle of incidence bandwidth in the xz-plane, the angle of incidence bandwidth also including larger illumination angles, that is to say illumination angles that are more inclined in relation to the field plane 9, than the smaller illumination angle bandwidth in the impingement plane parallel to the yz-plane.

Entrance pupil plane 21 and exit pupil plane 21' are conjugate to one another. If the projection optical unit 7 does not have an anamorphic embodiment, then the imaging scale of the projection optical unit is directionally independent, and so the entrance pupil aspect ratio L/K equals the exit pupil aspect ratio L'/K'. Thus, in this case, the object structures and accordingly the image structures 13 are impinged with a significantly larger angle of incidence bandwidth in the xz-plane, the angle of incidence bandwidth in this case also including larger illumination angles, that is to say illumination angles that are more inclined in relation to the field plane 5, than the smaller illumination angle bandwidth in the impingement plane parallel to the yz-plane.

If the projection optical unit 7 has an anamorphic embodiment, then the imaging scale is directionally dependent, and so the entrance pupil aspect ratio L/K does not equal the exit pupil aspect ratio L'/K'. In this case, L'/K'>1 still applies for the exit pupil aspect ratio, but no general statement can be made about the entrance pupil aspect ratio L/K. In FIG. 2, the case of an anamorphic projection optical unit 7 is indicated by virtue of the shape of the entrance pupil 20 differing from the shape of the exit pupil 20'.

A direction of extent of the structures, of the object structures and of the image structures 13 extends parallel to the substrate displacement direction 16a (y-direction).

A longitudinal direction of extent x of the exit pupil 20' on the one hand and a normal z to the object field 4 or the image field 8 define an xz-plane, to which the direction of extent y of the structure is perpendicular. For a non-anamorphic projection optical unit 7, the xyz-coordinate system may also be defined by way of the longitudinal direction of extent x of the pupils 20, 22.

A polarization direction 24 and 24', respectively, along which the illumination light 3 impinging firstly the object field 4 via the illumination pupil 22 and secondly the projection optical unit 7 via the entrance pupil 20 is polarized, is moreover depicted in FIG. 2. In this case, the illumination light 3 is linearly polarized. The polarization direction 24 and 24', respectively, extends in the y-direction, that is to say parallel to the direction of extent y of the structure. The preferred orientation of the extent of the structure, described further above, leads to this preferred orientation of the polarization direction 24. This allows a fixed choice of the polarization direction 24, that is to say it need not necessarily be adjustable during the operation of the projection exposure apparatus 1.

Below, FIGS. 3 to 8 are used to describe various embodiments of the illumination optical unit, which are used within the projection exposure apparatus 1 for the illumination optical unit 6 according to FIG. 1 and which serve to generate the polarization direction 24 parallel to the y-direction. Components and functions corresponding to those which have already been explained above with reference to the respective preceding figures have the same reference signs and will not be discussed in detail again.

What is common to all exemplary embodiments is that there is at least one reflection with a beam deflection for an angle of between 75° and 100° and that the illumination light 3 extends approximately in the xz plane during the reflection. Thus, the y-axis extends approximately parallel to the surface of the mirror used for this reflection. By way of example, the y-axis may be twisted through less than 15° in relation to the surface of the mirror.

The normal of a mirror used for the beam deflection is always in the plane in which the incident and the reflected illumination light 3 extend. The normal of the mirror used for beam deflection in the exemplary embodiments is therefore approximately in the xz-plane and is twisted for example by no more than 15° in relation thereto.

A beam deflection for an angle of between 75° and 100° is advantageous for illumination light 3 with wavelengths in the EUV range. In general, there should be a reflection with a beam deflection through an angle of approximately twice the Brewster angle. Twice the Brewster angle may deviate significantly from 90°, for example for wavelengths in the DUV range. For example, the beam deflection may be implemented for an angle which deviates by no more than 20% from twice the Brewster angle.

Figure 3:
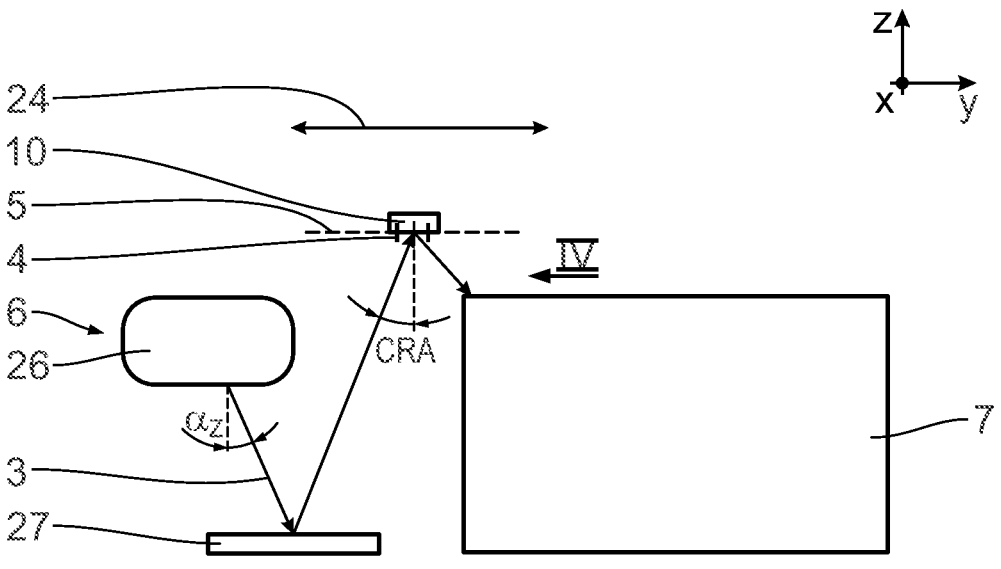
FIG. 3 schematically shows a plan view of a schematic beam guidance of the illumination light in one variant of an illumination optical unit of the projection exposure apparatus, depicted from a viewing direction corresponding to that of FIG. 1.
Figure 4:
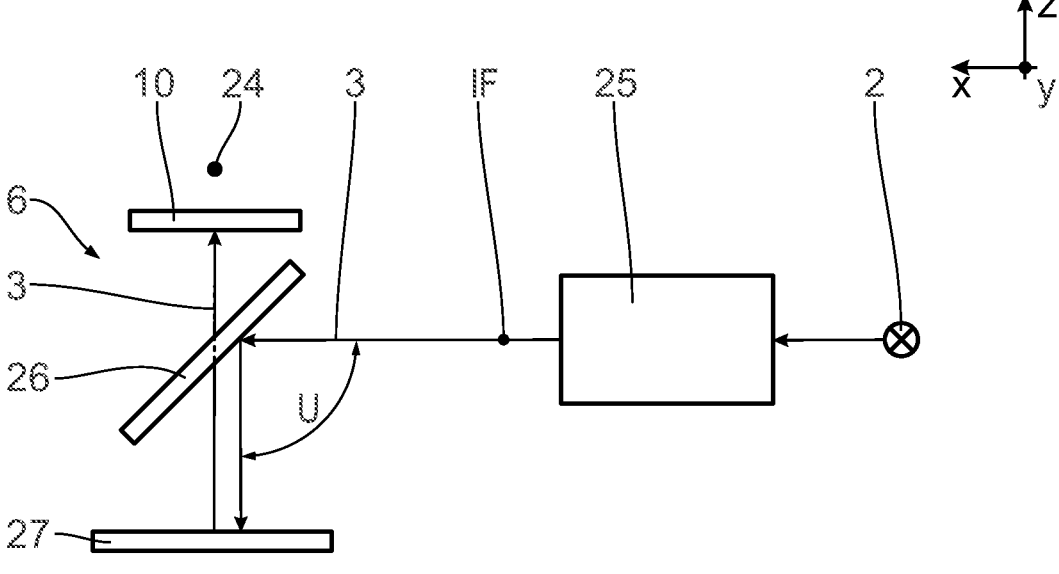
FIG. 4 shows a view of main components of the illumination optical unit, as seen from viewing direction IV in FIG. 3.

FIGS. 3 and 4 show the illumination optical unit 6 as a first embodiment which may be used in the projection exposure apparatus 1. In this case, FIG. 3 shows a view which corresponds to the orientation according to FIG. 1 in relation to the impingement of the object field 4, and FIG. 4 shows a view rotated through 90° about the z-axis such that the object displacement direction y points toward the observer.

Proceeding from the light source 2, the illumination light 3 represented very schematically as a single beam initially passes through a collector 25 and is then focused on an intermediate focus IF (cf. FIG. 4).

After passing through the intermediate focus IF, the illumination light 3 is reflected by a field facet mirror 26 of the illumination optical unit and deflected by a deflection angle U in the range of between 75° and 100° in the process. This deflection angle U is approximately 90° in the exemplary embodiment according to FIGS. 3 and 4. As shown in FIG. 4, the illumination light 3 initially propagating in the x-direction is deflected in such a way that it propagates approximately in the z-direction. Thus, the illumination light 3 extends approximately in the xz-plane before and after the reflection at the field facet mirror 26 of the illumination optical unit 6. As FIG. 3 shows, the illumination light 3 post-reflection at the field facet mirror 26 does not extend exactly in the z-direction but forms an angle $\alpha_z$ with the z-axis in the yz-plane. In FIG. 3, the angle $\alpha_z$ is approximately 20°. The field facet mirror 26 is accordingly tilted about the z-axis by half this angle, that is to say by approximately 10° in the present case.

Following the reflection at the field facet mirror 26, the illumination light 3 is reflected at the pupil facet mirror 27 of the illumination optical unit 6.

On account of the 90° deflection during the reflection at the field facet mirror 26, the illumination light 3 becomes s-polarized in relation to the plane of incidence at the field facet mirror 26, that is to say then has the polarization direction 24 approximately in the y-direction. The subsequent reflections of the illumination light 3 have no substantial change in the polarization direction 24 as a consequence.

Following the reflection at the pupil facet mirror 27, the illumination light 3 is guided toward the object field 4 and is reflected there by the reticle 10, in accordance with what has already been explained above in relation to FIGS. 1 and 2.

Examples of configurations of the facet mirrors 26, 27 of the illumination optical unit are described in U.S. Pat. No. 9,304,405 B2, for example. One of the facet mirrors may be embodied as a specular reflector, as is likewise described in U.S. Pat. No. 9,304,405 B2, for example in conjunction with the embodiment according to FIGS. 12 and 13.

The field facet mirror 26 may have a plurality or multiplicity of field facets, for example field facets that are switchable between multiple tilt positions, which are not depicted in any more detail in the drawing. By way of downstream components of the illumination optical unit 6, these field facets are imaged or virtually imaged into the object field 4. Each of these field facets may in turn be constructed from a plurality of individual mirrors, with dynamic assignment of individual mirror groups to corresponding field facets being possible.

Each field facet of the field facet mirror 26 may be assigned a pupil facet (likewise not depicted in more detail in the drawing) of the pupil facet mirror 27.

The field facet mirror 26 is arranged in the region of a field plane of the illumination optical unit 6 that is conjugate to the object plane 5. The pupil facet mirror 27 is arranged in the region of a pupil plane of the optical system 19, for example in the illumination pupil plane 23 or in a plane conjugate thereto. The illuminated pupil facets of the pupil facet mirror 27 serve to define an illumination angle distribution when the object field 4 is illuminated with the illumination light 3. By way of a tiltability of the field facets, it is possible to select which of the pupil facets of the pupil facet mirror 27 are in fact impinged by the illumination light 3. Consequently, it is possible to define the illumination angle distribution, that is to say the illumination setting.

Figure 5:
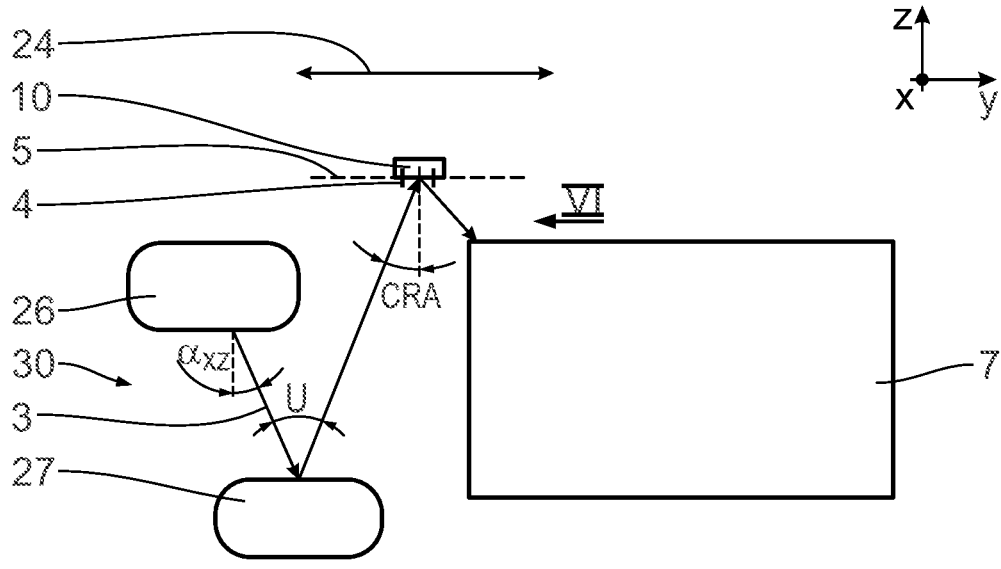
FIG. 5 shows, in a representation similar to that of FIG. 3, a further embodiment of an arrangement of main components of an embodiment of the illumination optical unit for the projection exposure apparatus according to FIG. 1.
Figure 6:
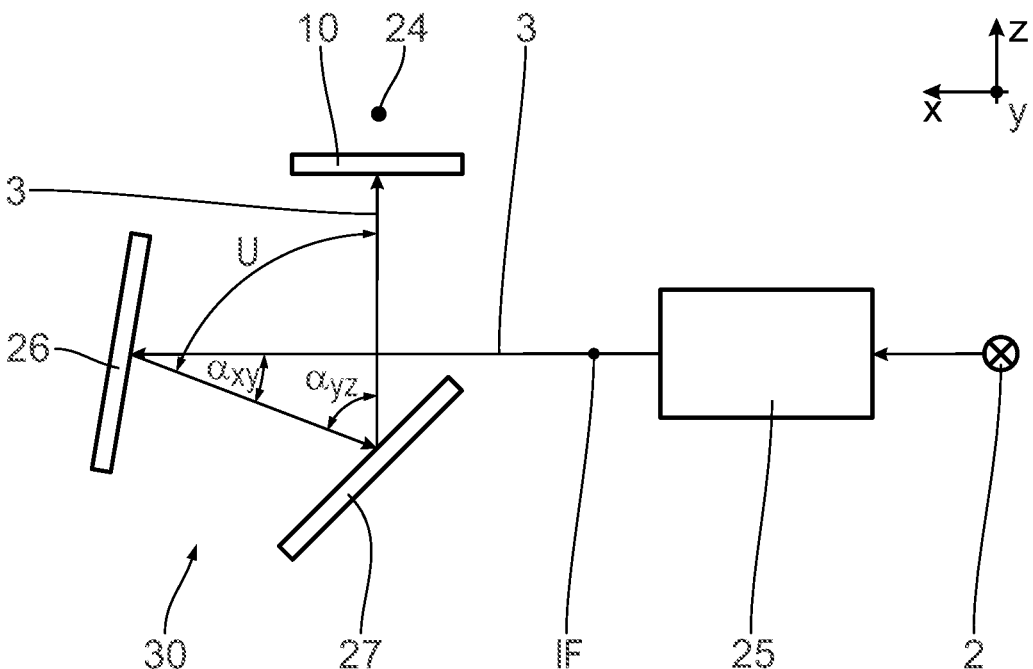
FIG. 6 shows, in a representation similar to that of FIG. 4, the embodiment according to FIG. 5, as seen from viewing direction VI in FIG. 5.

In an alternative illumination optical unit 30 according to FIGS. 5 and 6, the polarization direction 24 is generated during the reflection of the illumination light 3 at the pupil facet mirror 27, which brings about a deflection of approximately 90° in this embodiment of the illumination optical unit 30. The deflection angle during the reflection of the illumination light 3 at the pupil facet mirror 27 is of the order of approximately 80°.

The beam guidance of the illumination optical unit 30 (cf. FIG. 6) between the light source 2 and the field facet mirror 26 is initially comparable to that of the illumination optical unit 6 according to FIGS. 3 and 4. As shown in FIG. 6, the illumination light 3 extends approximately along the x-axis before the reflection at the pupil facet mirror 27 while it extends approximately along the z-axis after the reflection at the pupil facet mirror. Thus, the illumination light 3 extends approximately in the xz-plane before and after the reflection at the pupil facet mirror 27 of the illumination optical unit 6.

The illumination light 3 coming from the intermediate focus IF is reflected out of the xz-plane by the field facet mirror 26, once again into the yz-plane. The illumination light 3 does not extend exactly along the x-axis between the facet mirrors 26, 27 but rather at an angle in relation to all three Cartesian planes xy, yz and xz, FIGS. 5 and 6 plotting examples in the respective projections onto the yz-plane (FIG. 5) and onto the xz-plane (cf. FIG. 6) for these three angles $\alpha_{xy}$, $\alpha_{yz}$ and $\alpha_{xz}$.

The deflection angle U of the illumination light 3 at the pupil facet mirror 27 is also in each case specified in the projections onto the yz-plane and onto the xz-plane in FIGS. 5 and 6. This deflection angle U is approximately 80°.

Once again, the polarization direction 24 approximately in the y-direction is generated by the reflection at the pupil facet mirror 27.

In the configuration according to FIGS. 3 and 4, the field facet mirror 26 may be the only mirror of the illumination optical unit 6 which deflects the illumination light 3 with a deflection angle of approximately 90°. In comparison thereto, the other mirrors may be impinged with the illumination light 3 with close to the perpendicular incidence, that is to say with angles of incidence that are less than 25°, less than 20°, less than 15° and may also be less than 10°.

Accordingly, the pupil facet mirror 27 of the illumination optical unit 30 according to FIGS. 5 and 6 may be the only mirror which deflects the illumination light 3 with a deflection angle of the order of 90°, whereas all other mirrors of the illumination optical unit 30 are impinged with approximately perpendicular incidence.

On account of the small angle of incidence of the illumination light 3 on the pupil facet mirror 27 in the embodiment according to FIGS. 3 and 4, there is the option of arranging the pupil facet mirror 27 at a pupil plane of the optical system 19 to a good approximation. This allows the object field 4 to be illuminated from different illumination directions without an undesirable field dependence. Each field point of the object field 4 can then be illuminated with the same defined illumination light intensity from the various illumination directions.

Figure 7:
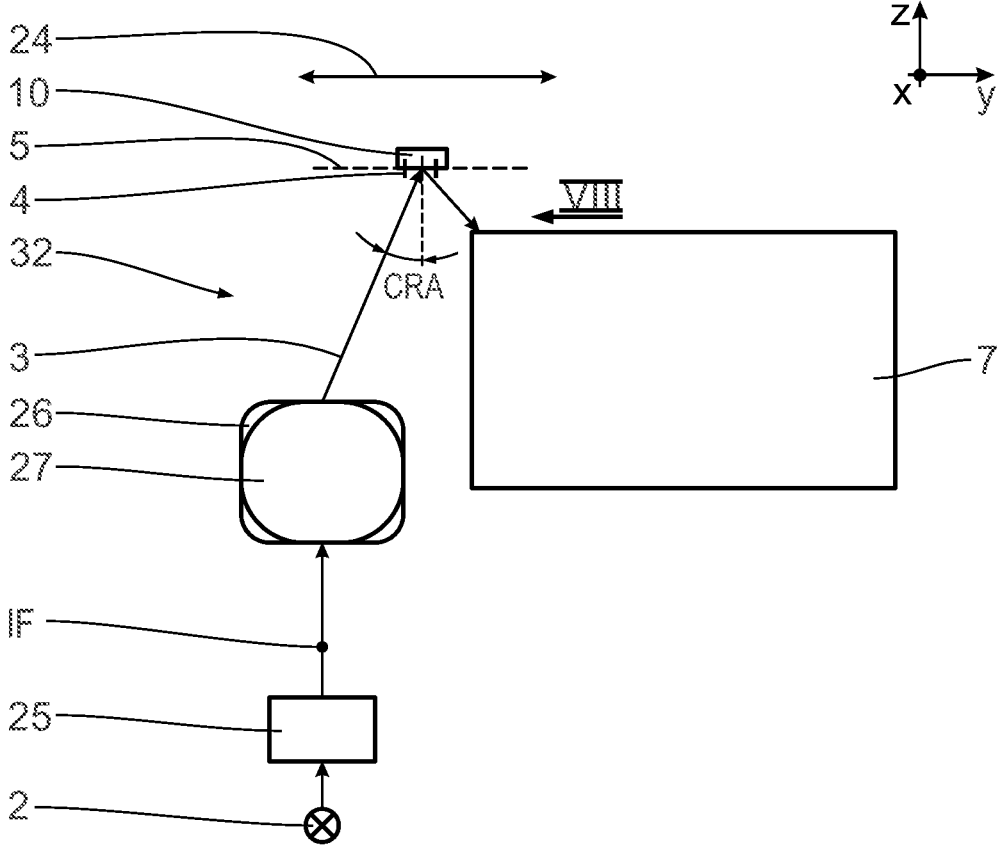
FIG. 7 shows, in a representation similar to that of FIG. 3, a further embodiment of an arrangement of main components of an embodiment of the illumination optical unit for the projection exposure apparatus according to FIG. 1.

FIGS. 7 and, 8 show a further embodiment of an illumination optical unit 32, which can be used instead of the illumination optical units 6 or 30 in the projection exposure apparatus 1.

In the illumination optical unit 32, the illumination light 3 that emanates from the light source 2 and extends through the intermediate focus IF after passage through the collector 25 initially extends in the z-direction. Subsequently, the illumination light 3 is deflected through approximately 90° in the xz-plane by the field facet mirror 26 and then extends in the negative x-direction. Subsequently, there is a further 90° deflection in the xz-plane such that the illumination light 3 subsequently extends in the z-direction again, apart from a chief ray angle CRA of approximately 6° (cf. FIG. 7, where this chief ray angle CRA is plotted schematically). In the illumination optical unit 32, the polarizing effect to the linear polarization of the illumination light 3 in the polarization direction 24 is amplified on account of the two reflections, firstly at the field facet mirror and secondly at the pupil facet mirror 27, with in each case deflection angles U of the order of approximately 90°.

In the illumination optical unit 32, the light source 2 can be arranged one floor below a production level, where the optical system 19 with the illumination optical unit 32 and the projection optical unit 7 is arranged.

The mirrors of the various variants of the illumination optical units 6, 30 and 32 may be provided with a highly reflective coating for the illumination light 3. This coating can be embodied as a multi-ply coating. For example, the coating may be designed as an for example periodic sequence of layers made of two or more different materials. These materials may be molybdenum and silicon.

In the case of such a coating and in the case of a deflection angle of approximately 90°, that is to say an angle of incidence of approximately 45°, there is a large difference in the reflection efficiency between illumination light 3 that has been s-polarized and illumination light 3 that has been p-polarized, in each case with respect to the plane of incidence. In this case, the s-polarized illumination light 3 is reflected with a much higher reflectivity than the p-polarized illumination light 3. Thus, the correspondingly coated mirror with the 90° deflection acts as a polarizer for the illumination light 3. The best polarization effect arises in the case of an incidence of the illumination light 3 below the Brewster angle. For many materials, the Brewster angle in the case of EUV wavelengths is not quite and, for example in the range between 40° and 45°, is for example 42°.

What is claimed is:

1. An optical system, comprising:
an illumination optical unit configured to guide illumination light to an object field in which a structured object is arrangeable, the structured object comprising one-dimensional object structures, the illumination optical unit configured so that the object field illuminated by the illumination optical unit has a first field extent along a first field coordinate and a second field extent along a second field coordinate perpendicular to the first field coordinate, the second field extent is less than the first field extent, the illumination optical unit configured so that the illumination light impinging on the object field is polarized in a polarization direction that extends parallel to the second field extent along the second field coordinate; and
a projection optical unit configured to guide the illumination light and imaging light from the object field toward an image field in which a substrate is arrangeable and onto which the one-dimensional object structures of the structured object are intended to be imaged,
wherein:
the optical system is configured to generate one-dimensional image structures by imaging the one-dimensional object structures of the structured object; and
the projection optical unit has an exit pupil in a pupil plane having a pupil aspect ratio between a first pupil extent in a longitudinal direction and a second pupil extent in a transverse direction that is greater than 3.

2. The optical system of claim 1, wherein the illumination optical unit comprises a polarization deflection mirror configured so that there is a deflection of the incident illumination light through a deflection angle in the range of between 75° and 100°, the polarization direction being perpendicular to a plane of incidence of the illumination light on the mirror polarization deflection mirror.

3. The optical system of claim 2, wherein the incident illumination light at the polarization deflection mirror runs in a plane of incidence deviating by no more than 15° from a plane defined by the first field coordinate and a normal to the object field.

4. The optical system of claim 2, wherein the illumination optical unit comprises a further mirror which is impinged by an angle of incidence of the illumination light that is less than 25°.

5. The optical system of claim 2, wherein the polarization deflection mirror comprises a field facet mirror.

6. The optical system of claim 2, wherein the polarization deflection mirror comprises a pupil facet mirror.

7. The optical system of claim 2, wherein the illumination optical unit comprises two polarization deflection mirrors at which the incident illumination light is deflected by a deflection angle in the range of between 80° and 100°, planes of incidence of the illumination light on the two polarization deflection mirrors being parallel to one another or coinciding with one another, and the polarization direction being perpendicular to the planes of incidence of the illumination light on the polarization deflection mirrors.

8. The optical system of claim 2, wherein the incident illumination light at the polarization deflection mirror runs in a plane of incidence deviating by no more than 15° from a plane defined by the first field coordinate and a normal to the object field, and the illumination optical unit comprises a further mirror which is impinged by an angle of incidence of the illumination light that is less than 25°.

9. The optical system of claim 8, wherein the polarization deflection mirror comprises a field facet mirror.

10. The optical system of claim 8, wherein the polarization deflection mirror comprises a pupil facet mirror.

11. The optical system of claim 8, wherein the illumination optical unit comprises two polarization deflection mirrors at which the incident illumination light is deflected by a deflection angle in the range of between 80° and 100°, planes of incidence of the illumination light on the two polarization deflection mirrors being parallel to one another or coinciding with one another, and the polarization direction being perpendicular to the planes of incidence of the illumination light on the polarization deflection mirrors.

12. The optical system of claim 1, wherein an illumination pupil of the illumination optical unit has a pupil aspect ratio that differs from 1.

13. The optical system of claim 1, wherein the image field has a first field extent along a first field coordinate, the image field has a second field extent along a second field coordinate perpendicular to the first field coordinate, the second field extent is less than the first field extent, and the optical system is configured to image one-dimensional object structures of the structured object that extend in a direction parallel to the second field extent of the object field.

14. The optical system of claim 13, wherein the longitudinal direction of extent of the exit pupil and a normal to the object field define a plane, and the second field coordinate of the object field is perpendicular to the plane defined by the longitudinal direction of extent of the exit pupil and the normal to the object field.

15. The optical system of claim 1, wherein the illumination optical unit comprises a polarization deflection mirror configured so that there is a deflection of the incident illumination light through a deflection angle in the range of between 75° and 100°, the polarization direction being perpendicular to a plane of incidence of the illumination light on the mirror polarization deflection mirror, and wherein the image field has a first field extent along a first field coordinate, the image field has a second field extent along a second field coordinate perpendicular to the first field coordinate, the second field extent is less than the first field extent, and the optical system is configured to image one-dimensional object structures of the structured object that extend in a direction of extent parallel to the second field extent of the object field.

16. The optical system of claim 1, wherein the illumination optical unit comprises a polarization deflection mirror configured so that there is a deflection of the incident illumination light through a deflection angle in the range of between 75° and 100°, the polarization direction being perpendicular to a plane of incidence of the illumination light on the mirror polarization deflection mirror, and wherein the image field has a first field extent along a first field coordinate, the image field has a second field extent along a second field coordinate perpendicular to the first field coordinate, the second field extent is less than the first field extent, and the optical system is configured to image one-dimensional object structures of the structured object that extend in a direction of extent parallel to the second field extent of the object field.

17. The optical system of claim 16, wherein the longitudinal direction of extent (x) of the exit pupil and a normal to the object field define a plane, and the second field coordinate of the object field is perpendicular to the plane defined by the longitudinal direction of extent of the exit pupil and the normal to the object field.

18. An apparatus, comprising:

an optical system according to claim 1;

an object holder configured to hold the object; and a substrate holder configured to hold the substrate, wherein the substrate holder is displaceable in a substrate displacement direction, and the apparatus is a projection exposure apparatus.

19. The apparatus of claim 18, further comprising an EUV light source.

20. A method, comprising:

providing the optical system of claim 1;

using the illumination optical unit to illuminate the object; and using the projection optical unit to project the illuminated object onto the substrate, wherein the object comprises a reticle, the substrate comprises a wafer, the method produces a structure on the wafer, and the structure comprises at least one member selected from the group consisting of a microstructure and a nanostructure.

\* \* \* \* \*